United States Patent [19]

Ehrenfeldner et al.

[11] Patent Number: 4,880,489
[45] Date of Patent: Nov. 14, 1989

[54] APPARATUS FOR PLASMA ETCHING CIRCUIT BOARDS OR THE LIKE

[75] Inventors: Richard Ehrenfeldner, Leoben; Dieter Wagner, Linz, both of Austria

[73] Assignee: Voest-Alpine Aktiengesellschaft, Linz, Austria

[21] Appl. No.: 900,446

[22] Filed: Aug. 26, 1986

[51] Int. Cl.⁴ .............................................. C23F 1/02
[52] U.S. Cl. .................................. 156/345; 204/298; 118/64; 118/66; 414/150; 414/153; 414/155; 414/160
[58] Field of Search ........................ 156/345; 204/298; 118/64, 66; 414/150, 155, 153, 160

[56] References Cited

U.S. PATENT DOCUMENTS

| | | | |
|---|---|---|---|
| 2,568,803 | 9/1951 | Guenst | 156/345 |
| 2,762,149 | 9/1956 | Mears | 156/345 |
| 3,163,572 | 12/1964 | David | 156/345 |
| 3,607,546 | 9/1975 | Grealey | 156/345 |
| 3,756,898 | 9/1973 | Frantzen et al. | 156/345 |
| 4,442,338 | 4/1984 | Yamazaki | 156/345 |

FOREIGN PATENT DOCUMENTS

| | | |
|---|---|---|
| 3041551 | 6/1982 | Fed. Rep. of Germany . |
| 53-114744 | 6/1978 | Japan . |
| 57-104668 | 6/1982 | Japan . |
| 57-161065 | 10/1982 | Japan . |

Primary Examiner—Kenneth M. Schor
Assistant Examiner—Lori-Ann Cody
Attorney, Agent, or Firm—Thomas R. Vigil

[57] ABSTRACT

The circuit board plasma etching apparatus includes a preheating chamber, a plasma reaction chamber and a cooling chamber for etching circuit boards with plasma in a quasi continuous operation. The plasma reaction chamber is sealed by a gas-tight preheating sealing slide adjacent the preheating chamber and by a gas-tight cooling sealing slide adjacent the cooling chamber. A preheating door selectively closes the preheating entry end and a cooling door selectively closes the cooling chamber exit end. Boards to be etched are placed in printed circuit board cages supported by a guide rail within the chambers. The guide rail is separable into a preheating segment, a reaction chamber segment and a cooling segment contained within the respective chambers. A preheating chamber bellows allows axial movement of the preheating door, as does a cooling chamber bellows for the cooling chamber door. Axial displacement of the doors allows selective segmentation of the guide rail. A bypass conduit selectively allows gas exhausted from the cooling chamber to be fed to the preheating chamber.

7 Claims, 1 Drawing Sheet

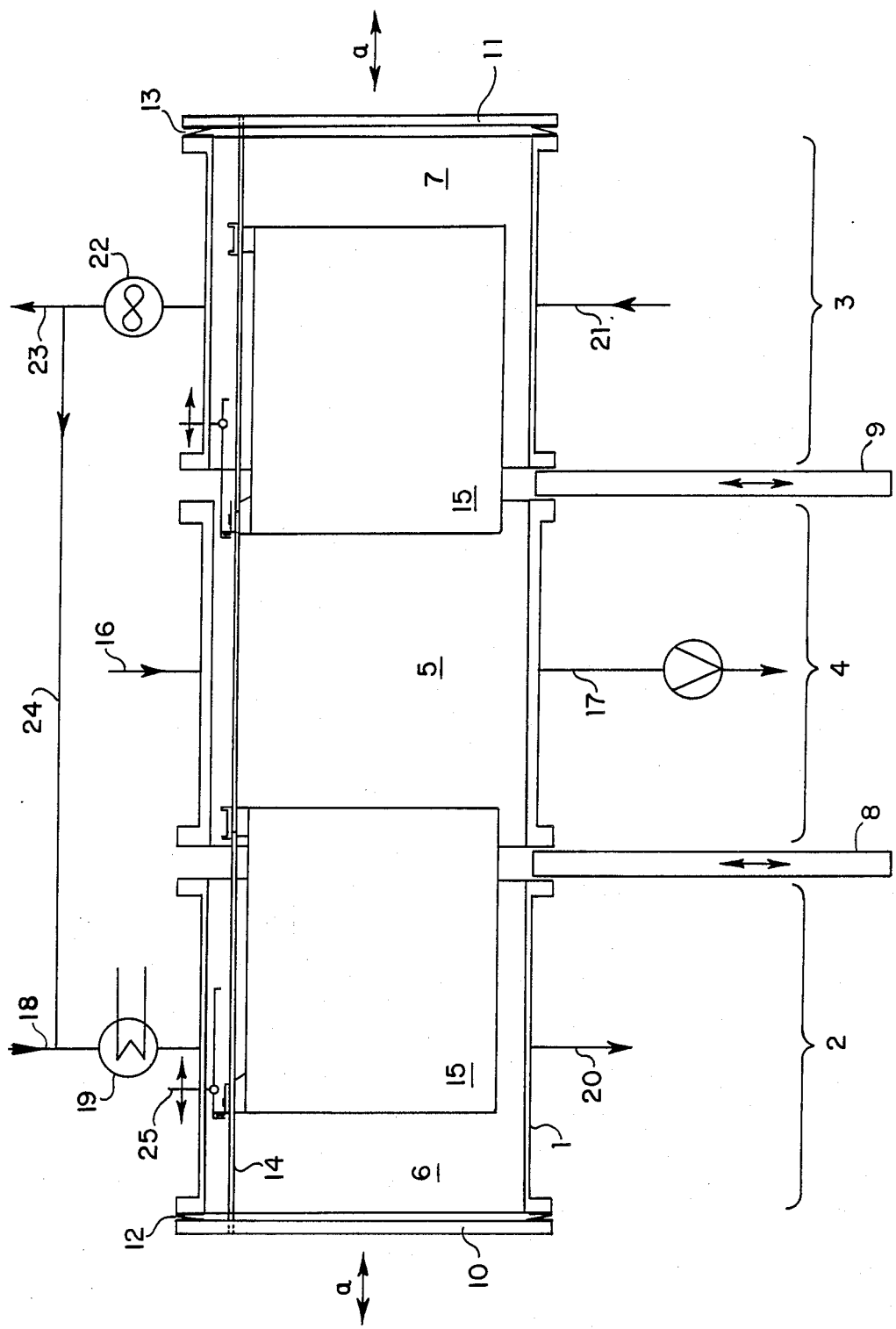

APPARATUS FOR PLASMA ETCHING CIRCUIT BOARDS OR THE LIKE

The invention relates to an apparatus for plasma etching circuit boards or the like, comprising a closable chamber for receiving the circuit boards to be treated.

When circuit boards are plasma etched, they are placed into a reactor chamber (cf. e.g. U.S. Pat. No. 4 285 800 or U.S. Pat. No. 4 289 598), a gas plasma being generated by introducing a gas and by means of electric discharges. The plasma reacts with the surface of the circuit boards, whereby above all organic impurities are etched away from the circuit board surfaces. More details on the general problems of the plasma etching of circuit boards are described e.g. in German Offenlegungsschrift 30 41 551.

Known reactors for plasma etching circuit boards have, in addition to a limited throughput quantity, above all the disadvantage of relatively long idle times arising as a result of loading and unloading between the individual treatment cycles. This not only increases the processing time of the circuit boards, but also unduly lowers the chamber temperature required for the process so that special heating cycles between the individual treatment cycles are required which further reduce the availability of the reactor. First a continuous processing plant presents itself as alternative, but it has become apparent that such a plant does not offer an economical solution because of the very high additional design expenditure, while the throughput quantity is not particularly increased.

In connection with the treatment of wafers with gaseous carbon tetrachloride a continuous apparatus has become known (JP-A-161 065), comprising a gas treatment chamber and a lock chamber in front of and a lock chamber behind such gas treatment chamber. The wafers may be moved on conveyor belts through these chambers which are obviously arranged horizontally. A part of the chamber cross section may be opened or closed by shut-off means. Since wafers are smaller in size than circuit boards by orders of magnitude, since no plasma is generated and since no preheating or cooling is provided, this known apparatus could never be used for plasma etching circuit boards or the like.

It should also be mentioned that JP-A-53-114 744 discloses an apparatus comprising two chambers, wherein a semiconductor substrate is "exposed" to electron or ion beams in a first chamber and this substrate is immediately etched with a reactive gas, such as hydrogen fluoride, in an adjacent chamber which is separable in a gas-tight manner. The problems underlying the present invention are not dealt with. The same applies to an even greater extent to the apparatus disclosed by JP-A-57-104 669, wherein wafers are immersed one after the other by grip arms in various liquid vessels for chemical treatment.

It is an object of the present invention to provide an apparatus for plasma etching in particular circuit boards, which guarantees a high throughput and great economic efficiency at low design expenditure.

This object may be achieved with an apparatus of the type mentioned above, in which the chamber is tubular and is arranged preferably horizontally, which comprises two outer zones and one center zone, the center zone being the plasma reaction chamber and being separable in a gas-tight manner from the two outer zones constituting the preheating and cooling chambers, respectively, by means of slides or the like, and the two outer zones each being closable by a door.

The solution according to the invention offers the possibility of loading and preheating a second charge during the plasma treatment of one charge, and at the same time cooling and unloading a third charge. The idle times due to the loading and unloading of known reactor chambers are avoided and there remains more time for the loading and unloading operations without impairing the process flow, which results in a longer life of the mechanical parts and offers the possibility of automating the loading and unloading operations. Moreover, the handling of hot parts can largely be avoided and disturbing residual gases are not present during loading and unloading.

An advantageous further embodiment of the invention is characterized by the tubular chamber comprising rails extending substantially along the entire length thereof for guiding a cage, container or the like receiving the circuit boards or the like. Loading and unloading as well as the throughput of the parts to be treated through the apparatus is substantially facilitated thereby.

If the rails are separable from one another or slidable into one another in the region of the slides, a gas-tight separation of the individual zones may be achieved in a simple manner without the disturbing influence of the rails.

In this case it is of particular advantage if the rails are capable of being connected with the doors and if the doors, when closed, are slidable axially, while the tightness is maintained, to an extent which permits separation of the rails in the region of the slides so that the individual chambers can be sealed from each other by means of the slides. In this way the rails may be separated from one another in a simple manner and subsequently the slides may be closed while the apparatus is completely tightly closed.

The doors are provided with a bellow-type seal to ensure that they are slidable.

In the apparatus according to the invention the heat balance may be improved in a simple manner by providing the preheating chamber with a heating gas (air) inlet and the cooling chamber with a cooling gas (air) inlet, at least a part of the cooling gas (air) leaving the cooling chamber being capable of being fed to the preheating chamber through a bypass conduit.

The invention and its additional advantages and features are described in greater detail in the following by means of an embodiment example illustrated in the drawing. The drawing shows a schematic side view, partially sectioned, of an apparatus according to the invention.

According to FIG. 1 the apparatus according to the invention comprises a tubular chamber 1 having e.g. circular cross section and being arranged preferably horizontally. The chamber comprises two outer zones 2, 3 as well as a center zone 4. The center zone 4 of the chamber 1 constitutes the plasma reaction chamber 5 and may be separated in a gas-tight manner from the two outer zones 2, 3 which constitute the preheating chamber 6 and the cooling chamber 7, respectively, by means of two slides 8, 9. The chamber 1 may be closed by doors 10 and 11, respectively, at its two ends. The doors 10, 11 are designed in such a manner that on the one hand they can be opened completely so that substantially the entire chamber cross section is open, but they may also be moved in the closed, tight state in the axial direction of the tubular chamber 1, as is indicated by the arrows a. In order to make this movement possible, each door comprises bellows 12 and 13, respectively.

Rails 14, in which cages 15 or similar containers are guided in a suspended manner, extend along the entire length of the chamber 1. The circuit boards or other objects to be etched are arranged in these cages 15. In order to allow sealing of the individual chambers by means of the slides 8, 9 despite the rails, the rails may be separated from one another in this region, which is possible in the following manner. In the region where the rails are separated, i.e. in the region of the slides 8, 9, the rails are slidable into one another or may be pulled apart so that the required separation is possible. In the region of the plasma reactor chamber 5 the rails are rigidly secured to the chamber wall in an appropriate manner, whereas the rails in the region of the front chamber 6 and the cooling chamber 7, respectively, are slidable in the logitudinal direction and may be secured with their outer ends to the doors 10 and 11, respectively. Thereby it is possible to separate the rails in the region of the slides 8 and 9, respectively, by moving the doors 10 and 11, respectively, in the sealing state to a certain extent outwards, the rails 14 in the region of the preheating chamber 6 and the cooling chamber 7, respectively, thus being capable of being pulled out of the rails in the region of the plasma reaction chamber 5 and the slides 8, 9 now being closable without impediment.

The plasma reaction chamber 5 is provided in a known manner with an inlet 16 and an outlet 17 for the plasma gas. The conduits are connected to the respective supply and vacuum systems. The electrodes required to generate the plasma are not shown. The preheating chamber 6 comprises an inlet 18 for the heating gas or the heating air, respectively, a heat exchanger 19, heater or the like being provided in the inlet. The air leaving the chamber 6 is removed through a conduit 20. In a similar manner cooling air or a cooling gas, respectively, is fed to the cooling chamber 7 through a conduit 21 and sucked off by means of a blower 22 through a conduit 23 from the chamber 7 again. At least a part of the heated air leaving the cooling chamber 7 may be fed to the preheating chamber 6 again through a bypass conduit 24.

Starting from a chamber which is completely empty at first, the quasi-continuous operation of the apparatus according to the invention is carried out as follows. The door 10 of the preheating chamber 6 is opened and a cage 15 with circuit boards to be treated is placed on the rails 14. The door 10 which is axially slidable owing to the bellow-type seal 12 is in its outermost position so that the rails 14 are separated in the region of the slide 8 and the slide 8 may be closed. After completion of the preheating step the slide 8 is opened, the door 10 is moved together with the rails 14 in the direction of the chamber so that the rails 14 are again connected in the region of the slide 8 and now the cage 15 with the circuit boards may be moved into the plasma reaction chamber 5. Now both slides 8 and 9 are closed and the etching operation in the plasma reaction chamber 5 may be performed. Independent thereof the door 10 may now be opened again and a new cage 15 with circuit boards may be placed into the preheating chamber. After completion of the etching step, the slide 9 is opened and a cage 15 is moved from the reaction chamber 5 into the cooling chamber 7. At the same time another cage 15 may be moved from the preheating chamber 6 into the reaction chamber 5. When the circuit boards in the cooling chamber 7 are sufficiently cooled, the door 11 may be opened and the cage 15 with the treated circuit boards is taken out. The connection of the rails in the region of the slide 9 is effected in the same manner by means of the axially slidable door 11 as described above in connection with the preheating chamber. An advance means 25 having e.g. a hydraulic or pneumatic drive may be provided to move the cages 15 along the rails 14, which is only suggested in the drawing and not described in greater detail.

It is shown that the apparatus according to the invention allows a quasi-continuous operation which avoids the relatively long idle times required so far. The entire heat balance is substantially more favourable than with the known systems. Loading and unloading of the apparatus may be effected in a simple manner and may, moreover, be automated with little expenditure. Although the drawing shows heating in the preheating chamber by means of hot air, the circuit boards may be heated in the preheating chamber also by infrared radiation.

We claim:

1. A plasma etching apparatus for etching circuit boards comprising a closable chamber for receiving the circuit boards to be treated, characterized in that the chamber (1) is tubular and is arranged generally horizontally, that said chamber comprises two outer zones (2, 3) at opposite ends of the tubular chamber and a center zone (4), the center zone (4) constituting a plasma reaction chamber (5) and being separable in a gas-tight manner from the two outer zones (2, 3) constituting a preheating chamber (6) and a cooling chamber (7), respectively, by means of slides (8, 9) positioned such that they can be operated to effect said gas tight separation, that the two outer zones (2, 3) each are closable by a respective door (10 or 11), that said tubular chamber (1) comprises rails (14) extending substantially along the entire length thereof to guide a cage (15) or container receiving the circuit boards which cage or container is provided within said tubular chamber, and that said rails (14) are separable from one another and are slidable into one another in the region of each slide (8, 9).

2. The apparatus according to claim 1, characterized in that the rails (14) may be connected with the doors (10, 11) and that the doors (10, 11) in the closed state are slidable axially, while tightness is maintained, to an extent which permits a separation of the rails (14) in the region of the slides (8, 9) so that the individual chambers (5, 6, 7) may be sealed from one another by means of the slides (8, 9).

3. The apparatus according to claim 2, characterized in that the doors (10, 11) comprise a bellow-type seal (12, 13).

4. A circuit board plasma etching apparatus comprising:
a preheating chamber for heating a circuit board which is to be etched by a plasma, said chamber being generally tubular and having a predetermined preheating chamber internal diameter between a preheating entry end and a preheating exit end;
a preheating door selectively closing the preheating entry end at least when a circuit board is being heated;
a plasma reaction chamber for plasma etching the circuit board generally axially aligned horizontally with, and receiving heted circuit boards from, said preheating chamber, for etching a received circuit board by a plasma, said chamber being generally tubular and having a predetermined reaction chamber internal diameter approximately equal to the preheating chamber internal diameter between a reaction entry end and a reaction exit end;

preheating sealing means selectively providing a gas-tight seal of the reaction entry end at least when a circuit board is being etched, said preheating sealing means comprising a preheating slide movable transverse of the axis of said reaction chamber selectively to open the reaction entry end when said reaction chamber is receiving the heated circuit boards and to provide a gas-tight seal of said reaction chamber when a circuit board is being etched;

cooling sealing means selectively providing a gas-tight seal of the reaction exit end at least when a circuit board is being etched, said cooling sealing means comprising a cooling slide movable transverse of the axis of said reaction chamber selectively to open the reaction exit end when etched circuit boards are being discharged and to provide a gas-tight seal of said reaction chamber when a circuit board is being etched;

a cooling chamber for cooling the circuit board generally axially aligned with, and receiving etched circuit boards from, said reaction chamber, for cooling etched circuit boards, said chamber being generally tubular and having a predetermined cooling chamber internal diameter approximately equal to the reaction chamber internal diameter between a cooling entry end and a cooling exit end;

a cooling door selectively closing the cooling exit end at least when a circuit board is being cooled;

a preheating gas inlet for furnishing heated gas to said preheating chamber and means for supplying preheated gas to said inlet;

a preheating gas outlet for exhausting gas from said preheating chamber;

a cooling gas inlet for furnishing cool gas to said cooling chamber and means for supplying cooling gas to said inlet;

a cooling gas outlet for exhausting gas from said cooling chamber;

a bypass conduit operatively connected to said cooling chamber and said preheating chamber for furnishing gas exhausted from said cooling chamber to said preheating chamber;

a plurality of circuit board cages for receiving the circuit boards; and a guide rail extending axially through said reaction chamber and into said preheating chamber and said cooling chamber for guiding said circuit board cages between chambers and supporting said circuit board cages within the chambers, said guide rail being selectively separable into a preheating segment contained within said preheating chamber, a reaction segment contained within said reaction chamber and extending generally axially between said preheating slide and said cooling slide, and a cooling segment contained within said cooling chamber, all provide when said preheating slide and said cooling slide are providing gas-tight seals to the ends of said reaction chamber; said preheating segment being brought into near contingent relation with said reaction segment when one of said circuit board cages is transferred between said preheating chamber and said reaction chamber, and said cooling segment being brought into near contingent relation with said reaction segment when one of said circuit board cages is transferred between said reaction chamber and said cooling chamber.

5. The apparatus of claim 4 wherein:

said preheating segment is axially slidable and is connected to said preheating door when said preheating door is closed;

said preheating door is axially displaceable in the closed position selectively to segment said guide rail by sliding said preheating segment in to and out of near contingent relation with said reactor segment;

said cooling segment is axially slidable and is connected to said cooling door when said cooling door is closed; and said cooling door is axially displaceable in the closed position selectively to segment said guide rail by sliding said cooling segment into and out of near contingent relation with said reactor segment.

6. The apparatus of claim 5 further including;

a chamber bellows operatively associated with one of said chambers to allow axial displacement of at least one of said doors closing one of said chambers with which said bellows is associated while preserving the seal between at least one of said doors and at least one of said chamber ends when at least one of said doors is closed.

7. The apparatus of claim 5 further including:

a preheating chamber bellows operatively associated with said preheating chamber to allow axial displacement of said preheating door while preserving the seal between said preheating door and the preheating chamber entry end when said preheating door is closed;

a cooling chamber bellows operatively associated with said cooling chamber to allow axial displacement of said cooling door while preserving the seal between said cooling door and the cooling chamber exit end when said cooling door is closed; and wherein said reactor segment is axially fixed with respect to said reactor chamber.

* * * * *